United States Patent [19]

Kim

[11] Patent Number: 5,684,735
[45] Date of Patent: Nov. 4, 1997

[54] SEMICONDUCTOR MEMORY CELL

[75] Inventor: Dal Soo Kim, Seoul, Rep. of Korea

[73] Assignee: LG Semicon Co., Ltd., Choongchungbuk-do, Rep. of Korea

[21] Appl. No.: 623,371

[22] Filed: Mar. 28, 1996

[30] Foreign Application Priority Data

May 25, 1995 [KR] Rep. of Korea .................. 13192/1995

[51] Int. Cl.$^6$ .......................... G11C 11/24; G11C 11/00
[52] U.S. Cl. .......................... 365/149; 365/154; 365/156
[58] Field of Search .......................... 365/149, 154, 365/156

[56] References Cited

U.S. PATENT DOCUMENTS

| | | | |
|---|---|---|---|
| 4,103,342 | 7/1978 | Miersch et al. | 365/149 |
| 4,921,813 | 5/1990 | Madan | 437/46 |
| 5,145,799 | 9/1992 | Rodder | 437/47 |
| 5,452,246 | 9/1995 | Kawashima | 365/149 |
| 5,459,686 | 10/1995 | Saito | 365/149 |

Primary Examiner—David C. Nelms
Assistant Examiner—Trong Quang Phan
Attorney, Agent, or Firm—Morgan, Lewis and Bockius LLP

[57] ABSTRACT

A semiconductor memory cell comprising a capacitor for storing data thereon, and a first transistor being switched in response to a logic state of a word line. The first transistor writes data on a bit line into the capacitor, reads the data stored on the capacitor and transfers the read data to the bit line. The semiconductor memory cell further comprises a second transistor being switched in response to the logic state of the word line. The second transistor writes data on a bit line bar into the capacitor, reads the data stored on the capacitor and transfers the read data to the bit line bar. The semiconductor memory cell further comprises a transistor device for holding the data stored on the capacitor. According to the present invention, the semiconductor memory cell has a reduced number of devices as compared with a conventional one to enhance a chip integration degree. Also, the semiconductor memory cell prevents a current path from being formed therein to reduce its power consumption and compensates for a charge leakage to always hold its written data at a stabilized state with no loss.

13 Claims, 2 Drawing Sheets

SEMICONDUCTOR MEMORY CELL

BACKGROUND OF THE INVENTION

1. Field of the Invention

The present invention relates in general to a semiconductor memory cell, and more particularly to a static random access memory (referred to hereinafter as SRAM) cell which has a reduced number of devices as compared with a conventional one to enhance a chip integration degree, always holds its written data at a stabilized state and reduces its power consumption.

2. Description of the Prior Art

Referring to FIG. 1, there is shown a circuit diagram of a conventional SRAM cell. As shown in this drawing, the conventional SRAM cell comprises four NMOS transistors Q1–Q4 and two resistors R1 and R2. The NMOS transistor Q1 has a source connected to a bit line BL, a gate connected to a word line W/L and a drain connected to a node A. The NMOS transistor Q2 has a source connected to a bit line bar BLB, a gate connected to the word line W/L and a drain connected to a node B. The bit line BL and the bit line bar BLB are complementary to each other. The NMOS transistor Q3 has a source connected to a ground voltage terminal, a gate connected to the node A and a drain connected to the node B. The NMOS transistor Q4 has a source connected to the ground voltage terminal, a gate connected to the node B and a drain connected to the node A. The resistor R1 has one terminal connected to a supply voltage source Vcc and the other terminal connected to the node A. The resistor R2 has one terminal connected to the supply voltage source Vcc and the other terminal connected to the node B.

The operation of the conventional SRAM cell with the above-mentioned construction will hereinafter be described in detail.

In order to write high logic data into the SRAM cell, both the word line W/L and the bit line BL must become high in logic. If the word line W/L is high in logic, the NMOS transistors Q1 and Q2 are both turned on. As a result, a high voltage on the bit line BL is transferred to the node A, whereas a low voltage on the bit line bar BLB is transferred to the node B. The NMOS transistor Q3 is turned on in response to the high voltage being transferred to the node A. The NMOS transistor Q4 is turned off in response to the low voltage being transferred to the node B. As the NMOS transistor Q3 is turned on, the node B remains at its low state. As the NMOS transistor Q4 is turned off, the node A remains at its high state due to a supply voltage from the supply voltage source Vcc. As a result, a high logic data is written into the SRAM cell and held therein. At this time, the NMOS transistor Q3 remains in its ON state.

On the other hand, in order to write low logic data into the SRAM cell, the word line W/L must become high in logic and the bit line BL must become low in logic. If the word line W/L is high in logic, the NMOS transistors Q1 and Q2 are both turned on. As a result, a low voltage on the bit line BL is transferred to the node A, whereas a high voltage on the bit line bar BLB is transferred to the node B. The NMOS transistor Q3 is turned off in response to the low voltage being transferred to the node A. The NMOS transistor Q4 is turned on in response to the high voltage being transferred to the node B. As the NMOS transistor Q3 is turned off, the node B remains at its high state due to the supply voltage from the supply voltage source Vcc. As the NMOS transistor Q4 is turned on, the node A remains in its low state. As a result, the low logic data is written into the SRAM cell and held therein. At this time, the NMOS transistor Q4 remains in its ON state. In a standby mode in which the written data is held in the SRAM cell, the NMOS transistor Q3 or Q4 remains at its ON state, resulting in a current path being formed between the supply voltage source and the ground voltage source. Current i flowing through the current path can be expressed by the following equation:

$$i = Vcc/(R_L + R_{on})$$

where, $R_L$ and $R_{on}$ are respective resistances of the resistor R1 and the NMOS transistor Q4 when the NMOS transistor Q4 is turned on and respective resistances of the resistor R2 and the NMOS transistor Q3 when the NMOS transistor Q3 is turned on.

In order to read the data written in the SRAM cell in the above manner, the word line W/L must become high in logic. If the word line W/L is high in logic, the NMOS transistors Q1 and Q2 are both turned on, thereby causing the voltages on the nodes A and B to be transferred to the bit line BL and the bit line bar BLB, respectively. As a result, the data written in the SRAM cell is read.

However, the above-mentioned conventional SRAM cell has a disadvantage in that it is large in size because it comprises four NMOS transistors Q1–Q4 and two resistors R1 and R2. The large cell size results of degradation in a chip integration degree. Also, power consumption is increased due to the current path formed by the turned-on NMOS transistor Q3 or Q4 in the standby mode. In order to reduce the standby current amount, the resistances of the resistors R1 and R2 must be made larger. Unfortunately, the larger resistances of the resistors R1 and R2 adversely affect the improvement of chip integration degree.

SUMMARY OF THE INVENTION

Therefore, the present invention has been made in view of the above problems, and it is an object of the present invention to provide an SRAM cell having a reduced number of elements to enhance chip integration degree. Another object of the invention is to reduce a power consumption of an SRAM and compensate for any charge leakage to maintain written data in a stabilized state.

In accordance with the present invention, the above and other objects can be accomplished by a provision of a semiconductor memory cell comprising a capacitor for storing data thereon; a first transistor being switched in response to a logic state of a word line, the first transistor writing data on a bit line into the capacitor, reading the data stored on the capacitor and transferring the read data to the bit line; a second transistor being switched in response to the logic state of the word line, the second transistor writing data on a bit line bar into the capacitor, reading the data stored on the capacitor and transferring the read data to the bit line bar; and data hold means for holding the data stored on the capacitor.

The data hold means compensates the data on the capacitor for a loss resulting from a charge leakage, so that the data can always stably be held.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
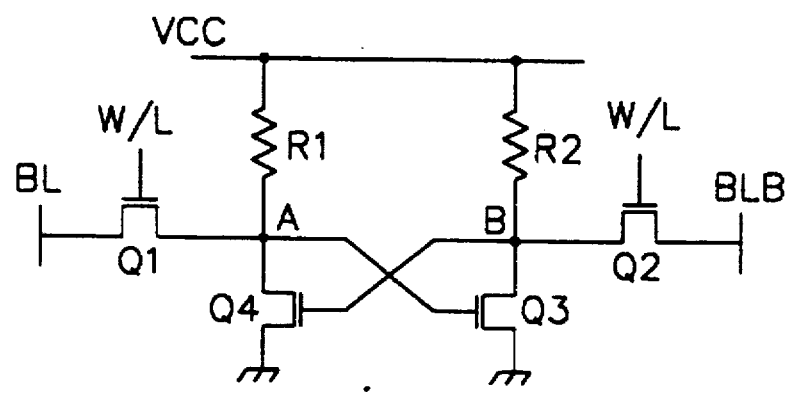
FIG. 1 is a circuit diagram of a conventional SRAM cell.
Figure 2:
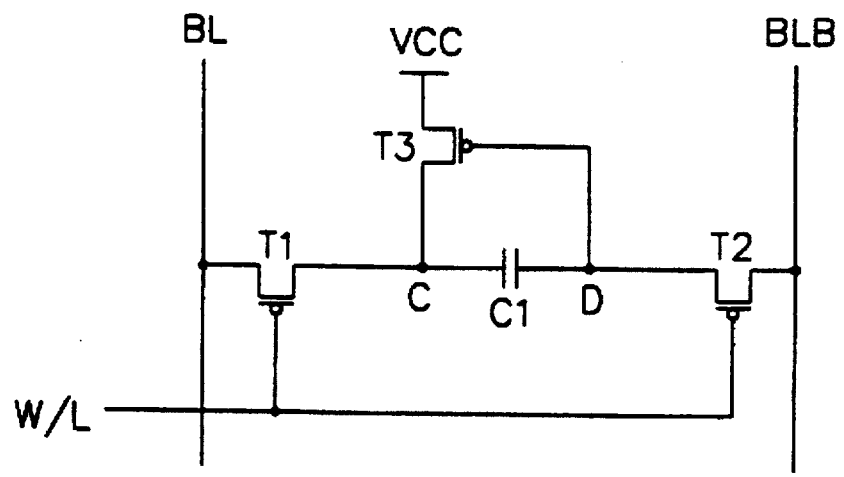
FIG. 2 is a circuit diagram of an SRAM cell in accordance with an embodiment of the present invention.

Referring to FIG. 2, there is shown a circuit diagram of an SRAM cell in accordance with an embodiment of the present invention. As shown in this drawing, the SRAM cell comprises three PMOS transistors T1-T3 and a capacitor C1. The PMOS transistor T1 has a drain connected to a bit line BL, a gate connected to a word line W/L and a source connected to a node C. The PMOS transistor T2 has a drain connected to a bit line bar BLB, a gate connected to the word line W/L and a source connected to a node D. The PMOS transistor T3 has a source connected to a supply voltage source Vcc, a gate connected to the node D and a drain connected to the node C. The capacitor C1 is connected between the nodes C and D to store charge thereon.

The operation of the SRAM cell with the above-mentioned construction in accordance with the embodiment of the present invention will hereinafter be described in detail.

In order to write high logic data into the SRAM cell, the word line W/L must become low in logic and the bit line BL must become high in logic. If the word line W/L is low in logic, the PMOS transistors T1 and T2 are both turned on. As a result, a high voltage on the bit line BL is transferred to the node C, whereas a low voltage on the bit line bar BLB is transferred to the node D. Then, the capacitor C1 becomes changed with the high voltage transferred to the node C, resulting in the high logic data being written into the SRAM cell. At this time, the PMOS transistor T3 remains at its ON state because its gate is applied with the low voltage on the node D. As the PMOS transistor T3 remains at its ON state, the written high logic data is continuously held in the SRAM cell with no loss although the PMOS transistors T1 and T2 are turned off when the word line W/L goes from low to high in logic. In other words, when turned on, the PMOS transistor T3 transfers a supply voltage from the supply voltage source Vcc to the node C. As a result, even if a charge leakage occurs in the capacitor C1, it is compensated by the supply voltage transferred by the turned-on PMOS transistor T3. In this manner, the written high logic data is always stably held in the SRAM cell.

On the other hand, in order to write low logic data into the SRAM cell, the word line W/L and the bit line BL must both become low in logic. If the word line W/L is low in logic, the PMOS transistors T1 and T2 are both turned on. As a result, a low voltage on the bit line BL is transferred to the node C, whereas a high voltage on the bit line bar BLB is transferred to the node D. As the node C becomes low in logic and the node D becomes high in logic, the low logic data is written into the SRAM cell. At this time, the PMOS transistor T3 is turned off because the node D is high in logic.

In order to read the data written in the SRAM cell in the above manner, the word line W/L must become low in logic. If the word line W/L is low in logic, the PMOS transistors T1 and T2 are both turned on, thereby causing the voltages on the nodes C and D to be transferred to the bit line BL and the bit line bar BLB, respectively. As a result, the data written in the SRAM cell is read.

As mentioned above, in accordance with the embodiment of the present invention, the SRAM cell has a reduced cell size as compared with the conventional one in that the SRAM of the present invention comprises only three PMOS transistors T1-T3 and one capacitor C1. Therefore, a chip integration degree is improved. Also, in the standby mode, only the current required by the PMOS transistor T3 for holding the written data is consumed with no further current path. Therefore, power consumption can be reduced. Further, the same effect can be obtained by substituting the PMOS transistors T1 and T2 with NMOS transistors and making the word line W/L active in high logic.

However, in the embodiment of the present invention, it may be difficult to hold the low logic data written in the SRAM cell. The reason for this is that a charge leakage in the capacitor C1 is not compensated in the case where the low logic data is written into the SRAM cell and the nodes C and D become low and high in logic, respectively. For the purpose of solving such a problem, there is provided an SRAM cell in accordance with an alternative embodiment of the present invention.

Figure 3:
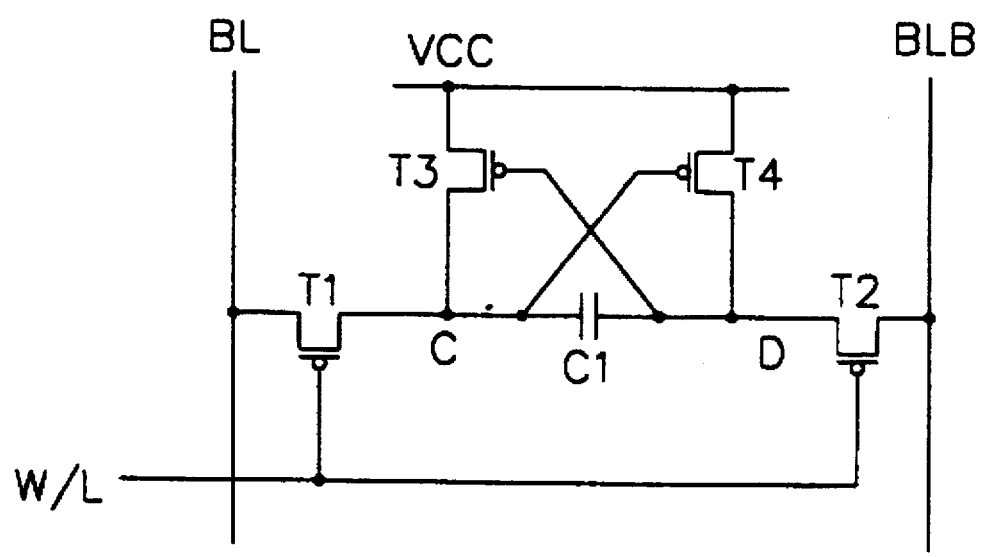
FIG. 3 is a circuit diagram of an SRAM cell in accordance with an alternative embodiment of the present invention.

Referring to FIG. 3, there is shown a circuit diagram of an SRAM cell in accordance with the alternative embodiment of the present invention. As shown in FIG. 3, the SRAM cell comprises a PMOS transistor T4 in addition to the construction of the embodiment in FIG. 2. The PMOS transistor T4 has a source connected to the supply voltage source Vcc, a gate connected to the node C and a drain connected to the node D.

The operation of the SRAM cell with the above-mentioned construction in accordance with the alternative embodiment of the present invention will hereinafter be described in detail.

In order to write high logic data into the SRAM cell, the word line W/L must become low in logic and the bit line BL must become high in logic. If the word line W/L is low in logic, the PMOS transistors T1 and T2 are both turned on. As a result, a high voltage on the bit line BL is transferred to the node C, whereas a low voltage on the bit line bar BLB is transferred to the node D. Then, the capacitor C1 becomes charged with the high voltage transferred to the node C, resulting in the high logic data being written into the SRAM cell. At this time, the PMOS transistor T3 remains at its ON state because its gate is applied with the low voltage on the node D. As the PMOS transistor T3 remains at its ON state, the written high logic data is continuously held in the SRAM cell with no loss although the PMOS transistors T1 and T2 are turned off when the word line W/L goes from low to high in logic, as stated previously in the first embodiment of the present invention.

On the other hand, in order to write low logic data into the SRAM cell, the word line W/L and the bit line BL must both become low in logic. If the word line W/L is low in logic, the PMOS transistors T1 and T2 are both turned on. As a result, a low voltage on the bit line BL is transferred to the node C, whereas a high voltage on the bit line bar BLB is transferred to the node D. Then, the high voltage transferred to the node D becomes charged in the capacitor C1, resulting in the low logic data being written into the SRAM cell. At this time, the PMOS transistor T4 remains at its ON state because its gate is applied with the low voltage on the node C. As the PMOS transistor T4 remains at its ON state, the written low logic data is continuously held in the SRAM cell with no loss although the PMOS transistors T1 and T2 are turned off when the word line W/L goes from low to high in logic. In other words, when turned on, the PMOS transistor T4 transfers the supply voltage from the supply voltage source Vcc to the node D. As a result, even if a charge leakage occurs in the capacitor C1, it is compensated by the supply voltage transferred by the turned-on PMOS transistor T4. In this manner, the written low logic data is always stably held in the SRAM cell.

In order to read the data written in the SRAM cell in the above manner, the word line W/L must become low in logic. If the word line W/L is low in logic, the PMOS transistors T1 and T2 are both turned on, thereby causing the voltages on the nodes C and D to be transferred to the bit line BL and the bit line bar BLB, respectively. As a result, the data written in the SRAM cell is read.

As apparent from the above description, in accordance with the second embodiment of the present invention, the chip integration degree can be enhanced and the power consumption can be reduced, similarly to the first embodiment of the present invention. Also, the data can always be stably read/written from/into the SRAM cell. Further, the same effect can be obtained by substituting the PMOS transistors T1 and T2 with NMOS transistors and making the word line W/L active in high logic.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory cell comprising:

a capacitor for storing data thereon;

a first transistor coupled to a word line and a first bit line and responsive to a logic state of the word line, the first transistor transferring data from the first bit line to the capacitor in a write mode and transferring data from the capacitor to the first bit line in a read mode;

a second transistor coupled to the word line and a second bit line and responsive to the logic state of the word line, the second transistor transferring data from the second bit line to the capacitor in a write mode and transferring data from the capacitor to the second bit line in a read mode, the second bit line being complementary to the first bit line; and a circuit consisting essentially of one transistor for holding data stored in the capacitor.

2. The semiconductor memory cell according to claim 1, wherein the transistor in the circuit comprises:

a source coupled to a voltage supply source;

a drain coupled to a first node between the first transistor and the capacitor; and a gate coupled to a second node between the second transistor and the capacitor.

3. The semiconductor memory cell according to claim 1, wherein the circuit maintains a logic high voltage at a node between the first transistor and the capacitor.

4. The semiconductor memory cell according to claim 1, wherein the capacitor includes a parasitic capacitor.

5. The semiconductor memory cell according to claim 1, wherein the one transistor in the circuit is a PMOS transistor.

6. A semiconductor memory cell comprising:

a capacitor for storing data thereon;

a first transistor coupled to a word line and a first bit line and responsive to a logic state of the word line, the first transistor transferring data from the first bit line to the capacitor in a write mode and transferring data from the capacitor to the first bit line in a read mode;

a second transistor coupled to the word line and a second bit line and responsive to the logic state of the word line, the second transistor transferring data from the second bit line to the capacitor in a write mode and transferring data from the capacitor to the second bit line in a read mode, the second bit line being complementary to the first bit line; and a circuit consisting essentially of two PMOS transistors for holding data stored in the capacitor, wherein one of the two PMOS transistors in the circuit includes:

a source coupled to a voltage supply source;

a drain coupled to a first node between the first transistor and the capacitor; and a gate coupled to a second node between the second transistor and the capacitor; and the other of the two PMOS transistors in the circuit includes:

a source coupled to the voltage supply source;

a drain coupled to the second node; and a gate coupled to the first node.

7. The semiconductor memory cell according to claim 6, wherein the two PMOS transistors in the circuit hold a high logic voltage at the first and second node, respectively.

8. The semiconductor memory cell according to claim 6, wherein one of the two PMOS transistors holds a logic high voltage at a node between the first transistor and the capacitor.

9. The semiconductor memory cell according to claim 6, wherein one of the two PMOS transistors holds a logic high voltage at a node between the second transistor and the capacitor.

10. The semiconductor memory cell according to claim 6, wherein the capacitor includes a parasitic capacitor.

11. A semiconductor memory cell consisting essentially of:

a capacitor for storing data thereon;

a first transistor coupled to a first bit line and a word line and responsive to a logic state of the word line, the first transistor transferring data from the first bit line to the capacitor in a write mode and transferring data from the capacitor to the first bit line in a read mode;

a second transistor coupled to a second bit line and the word line and responsive to the logic state of the word line, the second transistor transferring data from the second bit line to the capacitor in a write mode and transferring data from the capacitor to the second bit line in a read mode, the second bit line being complementary to the first bit line, the second transistor being coupled to the first transistor through the capacitor; and a third transistor including a source coupled to a voltage supply source, a drain coupled to a first node between a source of the first transistor and the capacitor and a gate coupled to a second node between the source of the second transistor and the capacitor.

12. The semiconductor memory cell according to claim 11, further comprising a fourth transistor including:

a source coupled to the voltage supply source;

a drain coupled to the second node; and a gate coupled to the first node.

13. The semiconductor memory cell according to claim 12, wherein the first, second, third and fourth transistors are PMOS transistors.

* * * * *